(12) United States Patent
Hirata

(10) Patent No.: US 10,665,391 B2
(45) Date of Patent: May 26, 2020

(54) CAPACITOR HAVING BOTTOM ELECTRODE COMPRISING TIN

(71) Applicant: Micron Technology, Inc., Boise, ID (US)

(72) Inventor: Kei Hirata, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 2 days.

(21) Appl. No.: 15/811,359

(22) Filed: Nov. 13, 2017

(65) Prior Publication Data

US 2019/0148067 A1 May 16, 2019

(51) Int. Cl.
*H01G 4/008* (2006.01)
*H01L 49/02* (2006.01)

(52) U.S. Cl.
CPC ............. *H01G 4/008* (2013.01); *H01L 28/65* (2013.01)

(58) Field of Classification Search
CPC .................. H01L 27/224; H01L 27/2418
See application file for complete search history.

(56) References Cited

U.S. PATENT DOCUMENTS

2002/0192901 A1* 12/2002 Kimura ................. H01L 27/108
438/253
2009/0174984 A1* 7/2009 Tachibana ......... H01L 27/11504
361/306.1

* cited by examiner

*Primary Examiner* — Jay C Chang
*Assistant Examiner* — Mikka Liu
(74) *Attorney, Agent, or Firm* — Dorsey & Whitney LLP

(57) ABSTRACT

Disclosed herein is an apparatus that includes a bottom electrode, a top electrode, and a dielectric film disposed between the bottom electrode and the top electrode. The bottom electrode includes TiN having more (111) crystal orientation than (200) crystal orientation.

13 Claims, 14 Drawing Sheets

CAPACITOR HAVING BOTTOM ELECTRODE COMPRISING TIN

BACKGROUND

A Titanium Nitride (TiN) film having a cylindrical shape is sometimes used for a bottom electrode of a cell capacitor included in DRAM (Dynamic Random Access Memory). However, if the film thickness of the TiN film of the bottom electrode is too thick, there is a problem that the internal diameter part of the cylinder is closed. On the other hand, if the film thickness of the TiN film of the bottom electrode is too thin, a problem occurs during a manufacturing process that the bottom electrode collapses or a HF (hydrogen fluoride) liquid used for etching silicon dioxide penetrates through the TiN film to etch silicon dioxide that is not to be etched. Therefore, the margin allowed for the film thickness of the TiN film of the bottom electrode is quite small.

In order to increase the margin allowed for the film thickness of the TiN film, improvement in the film quality of the TiN film itself may be desirable.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
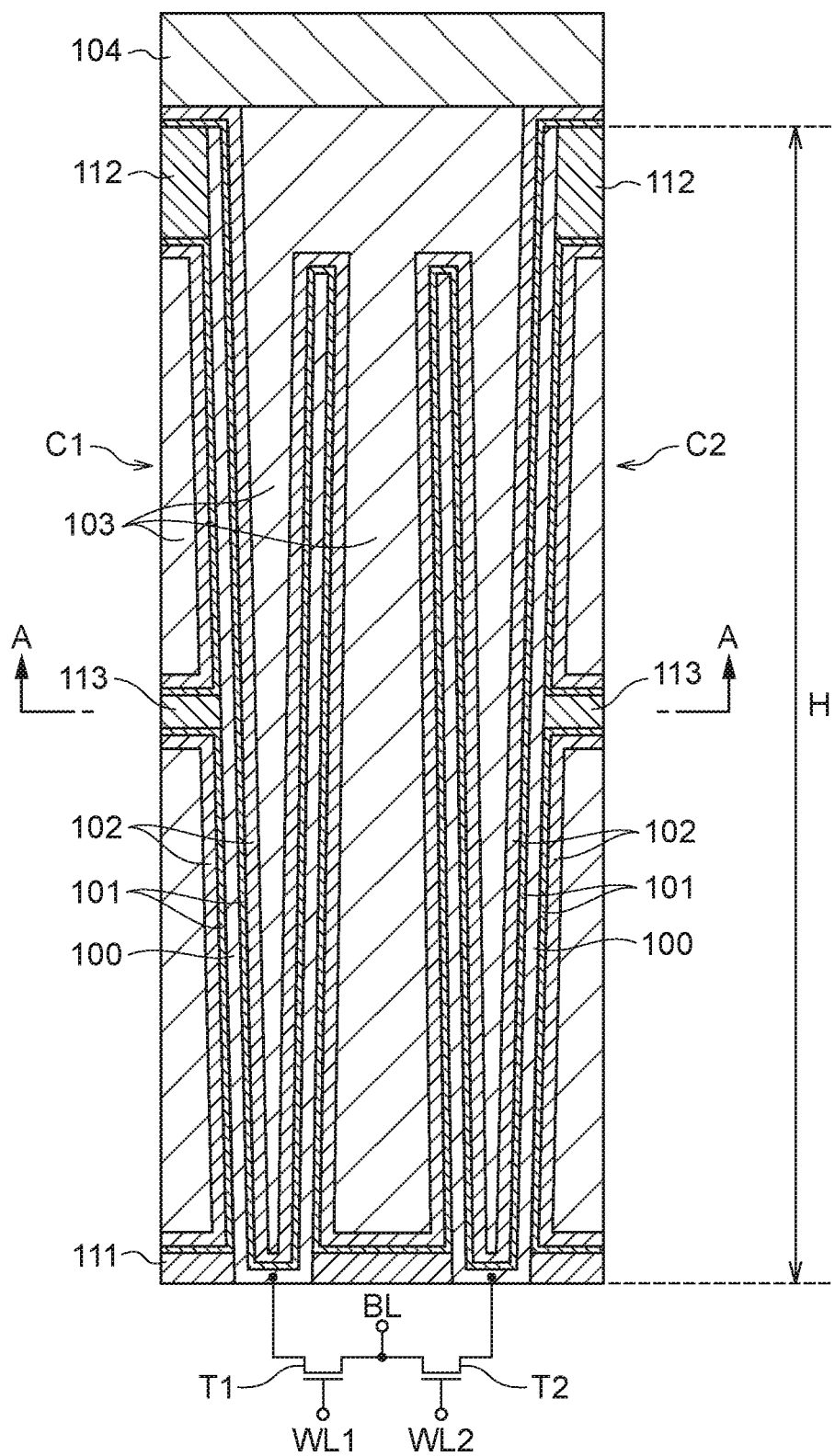
FIG. 1 is a schematic sectional diagram showing a configuration of a semiconductor device according to an embodiment of the disclosure.

A semiconductor device according to the present embodiment is a DRAM, and includes cell transistors T1 and T2 as shown in FIG. 1. The cell transistor T1 is connected between a bit line BL and a cell capacitor C1. A word line WL1 is connected to a gate electrode of the cell transistor T1. The cell transistor T2 is connected between the bit line BL and a cell capacitor C2. A word line WL2 is connected to a gate electrode of the cell transistor T2.

The cell capacitors C1 and C2 each include a bottom electrode 100 having a cylindrical shape, a dielectric film 101 covering an inner wall, an outer wall, and a bottom part of the bottom electrode 100, and a top electrode 102 covering the bottom electrode 100 with the dielectric film 101 interposed therebetween. The bottom electrodes 100 are connected to the cell transistors T1 and T2 at bottom parts of the cylinders, respectively. The cell capacitors C1 and C2 including the internal diameter parts of the cylinders are entirely embedded by a polysilicon film 103. The top surface of the polysilicon film 103 is covered by a plate electrode 104 including tungsten. Accordingly, the top electrode 102 is electrically short-circuited to the plate electrode 104 with the polysilicon film 103. As shown in FIG. 1, bottom parts of the bottom electrode 100 having the cylindrical shape are supported by a $Si_3N_4$ film 111, top parts thereof are supported by a $Si_3N_4$ film 112, and substantially-intermediate parts in the height direction are supported by a $Si_3N_4$ film 113.

The bottom electrode 100 and the top electrode 102 comprise TiN. The TiN comprised in the bottom electrode 100 includes more (111) crystal orientations than (200) crystal orientations. Particularly, it is preferable that the TiN of the bottom electrode 100 include more than seven times the (111) crystal orientations than the (200) crystal orientations. The crystal orientations of the TiN film can be determined by an XRD (X-Ray Diffraction) analysis. TiN with greater (111) crystal orientations is higher in mechanical strength than TiN with greater (200) crystal orientations. Accordingly, when the bottom electrode 100 is formed using TiN rich in the (111) crystal orientations, collapse of the cylinder or penetration of HF liquid through the TiN film during a manufacturing process does not occur even if the film thickness is reduced. In the present embodiment, the thickness of the bottom electrode 100 is preferably 45 Å to 140 Å, and is particularly preferably 45 Å to 70 Å. When the TiN comprised in the bottom electrode 100 includes only the (200) crystal orientations, the yield ratio deteriorates rapidly due to penetration of the HF liquid when the thickness of the bottom electrode 100 is equal to or less than 140 Å. However, in the bottom electrode 100 comprising TiN rich in the (111) crystal orientations, penetration of the HF liquid hardly occurs even if the thickness is equal to or less than 140 Å. The crystal orientations of the bottom electrode 100 indicate crystal orientations with reference to a foundation surface at the time of formation of the bottom electrode 100. Therefore, crystal orientations of the cylindrical part of the bottom electrode 100 are crystal orientations with reference to a surface substantially perpendicular to a silicon substrate, and crystal orientations of the bottom part of the bottom electrode 100 are crystal orientations with reference to a surface substantially horizontal to the silicon substrate.

The TiN comprised in the top electrode 102 may have the same crystal orientations as the TiN comprised in the bottom electrode 100 or may have a different crystal orientation. It is preferable that a high-K material be used as a material of the dielectric film 101. Although not particularly limited thereto, a height H of the bottom electrode 100 can be 1400 nm to 1600 nm.

Figure 2:
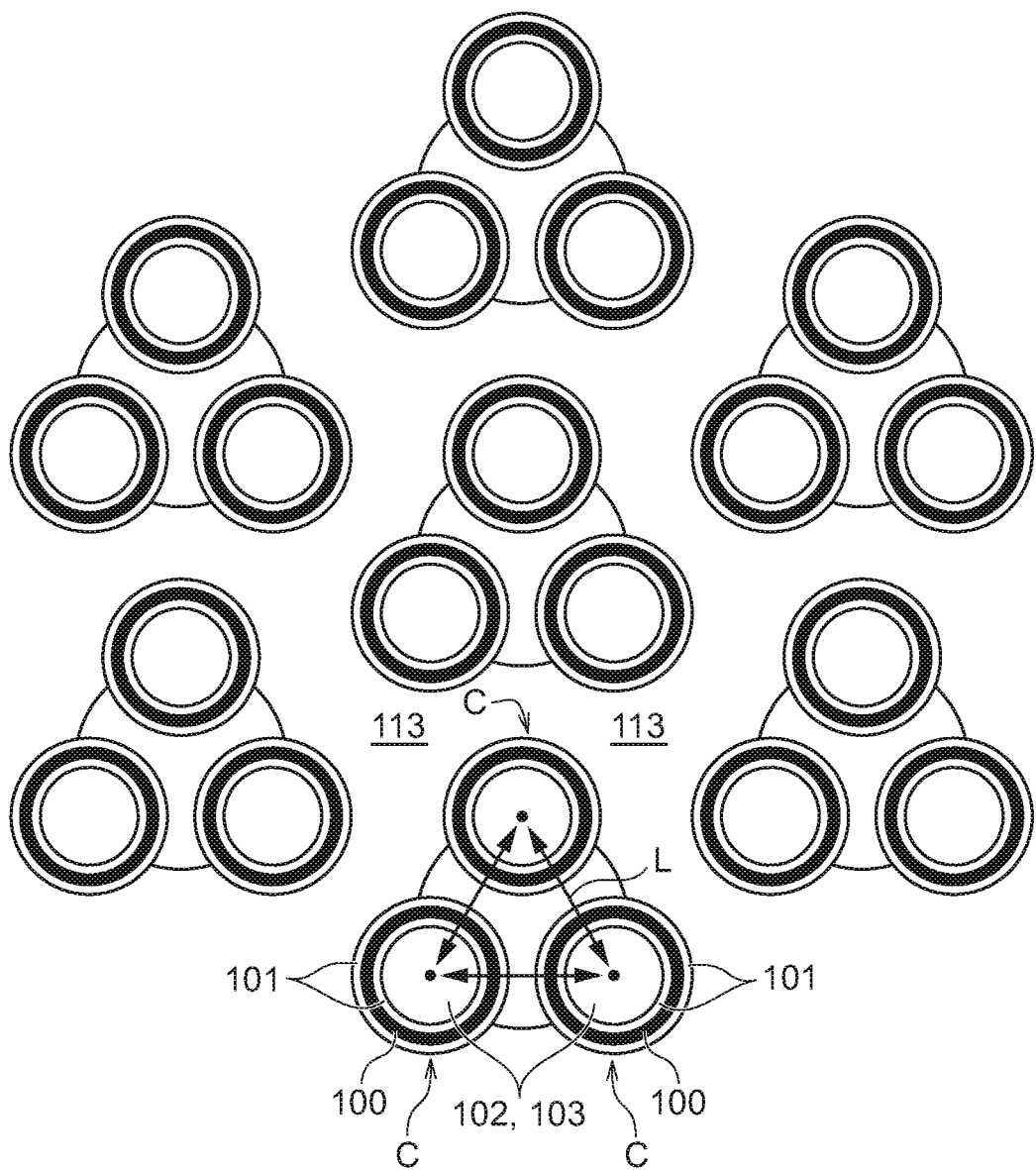
FIG. 2 is a schematic diagram showing a section indicated by A-A line of FIG. 1.

As shown in FIG. 2, cell capacitors C can be regularly arranged as viewed planarly. An arrangement pitch L of the cell capacitors C, that is, a distance between center points of adjacent cell capacitors C can be 50 nm to 70 nm in some embodiments of the disclosure.

Figure 3:
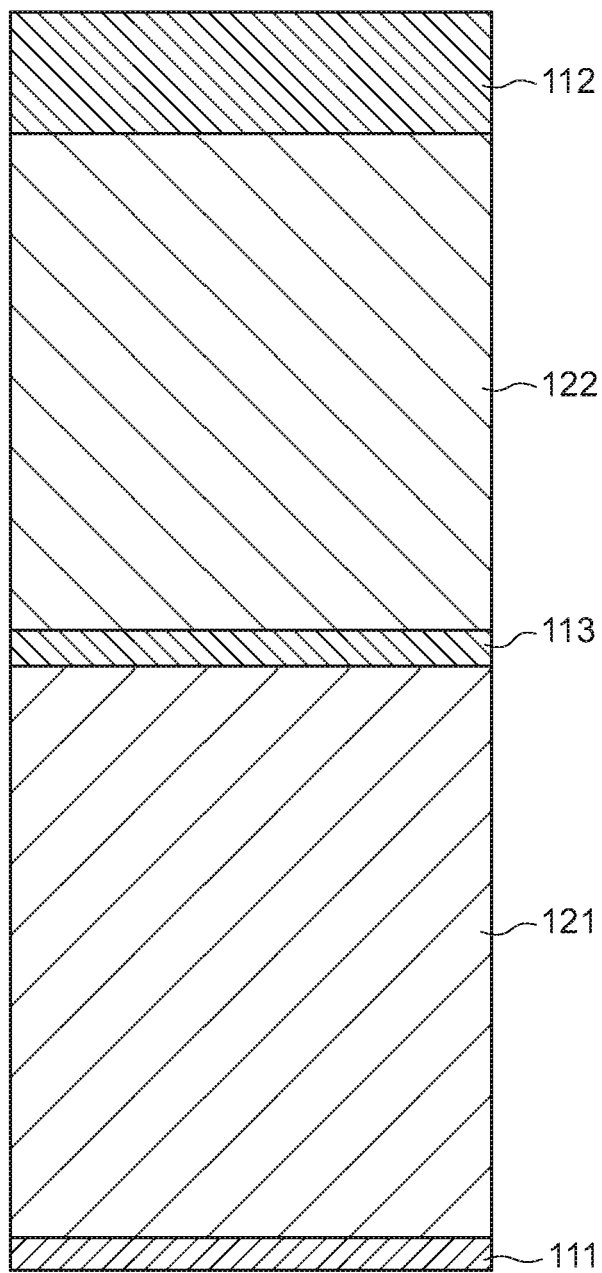
FIG. 3 to FIG. 14 are process diagram for explaining a manufacturing method of the semiconductor device shown in FIG. 1 according to an embodiment of the disclosure.
Figure 4:
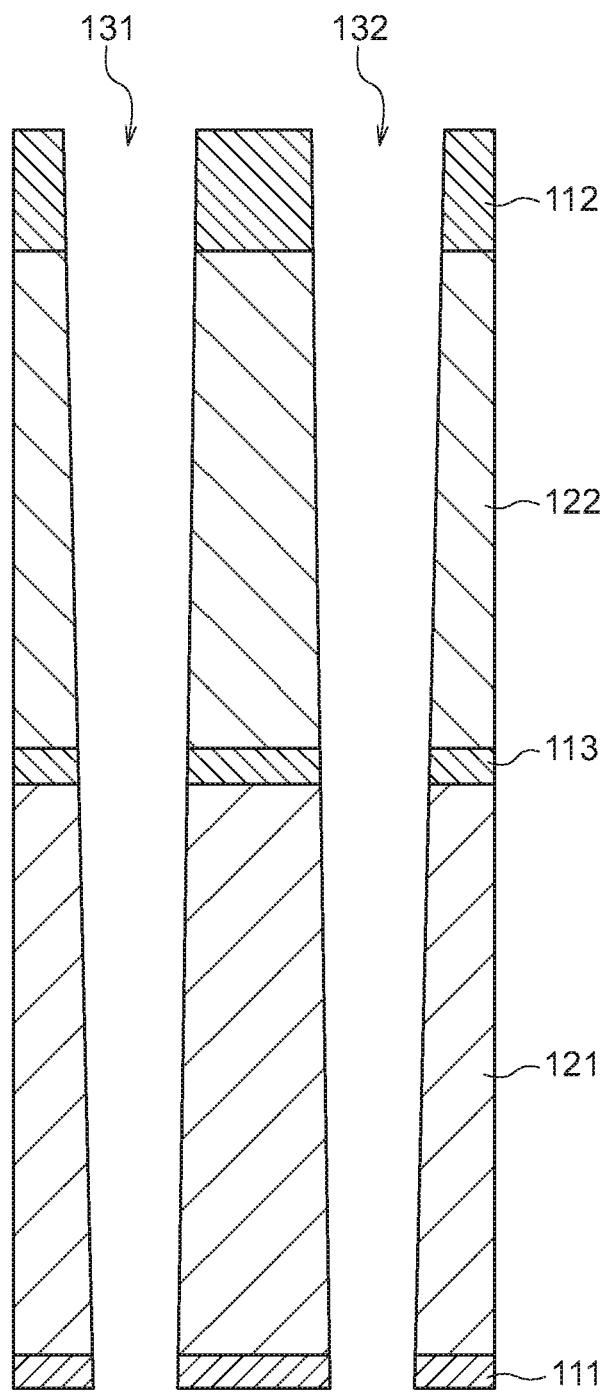

A manufacturing process of the cell capacitors C1 and C2 according to an embodiment of the disclosure is explained next. First, cell transistors and bit lines are formed on a semiconductor substrate, and then the $Si_3N_4$ film 111, a BPSG (Boro-Phospho Silicate Glass) film 121, the $Si_3N_4$ film 113, a $SiO_2$ film 122, and the $Si_3N_4$ film 112 are stacked in this order as shown in FIG. 3. The $Si_3N_4$ film 111 can be formed by an ALD (Atomic Layer Deposition) method and the $Si_3N_4$ film 113, the $SiO_2$ film 122, and the $Si_3N_4$ film 112 can be formed by a plasma CVD (Chemical Vapor Deposition) method. Next, a hard mask (not shown) is formed on the top surface of the $Si_3N_4$ film 112 and then dry etching is performed via the hard mask. Container holes 131 and 132 shown in FIG. 4 are thereby formed. The container holes 131 and 132 are provided to penetrate the $Si_3N_4$ film 112, the $SiO_2$ film 122, the $Si_3N_4$ film 113, the BPSG film 121, and the $Si_3N_4$ film 111.

Figure 5:
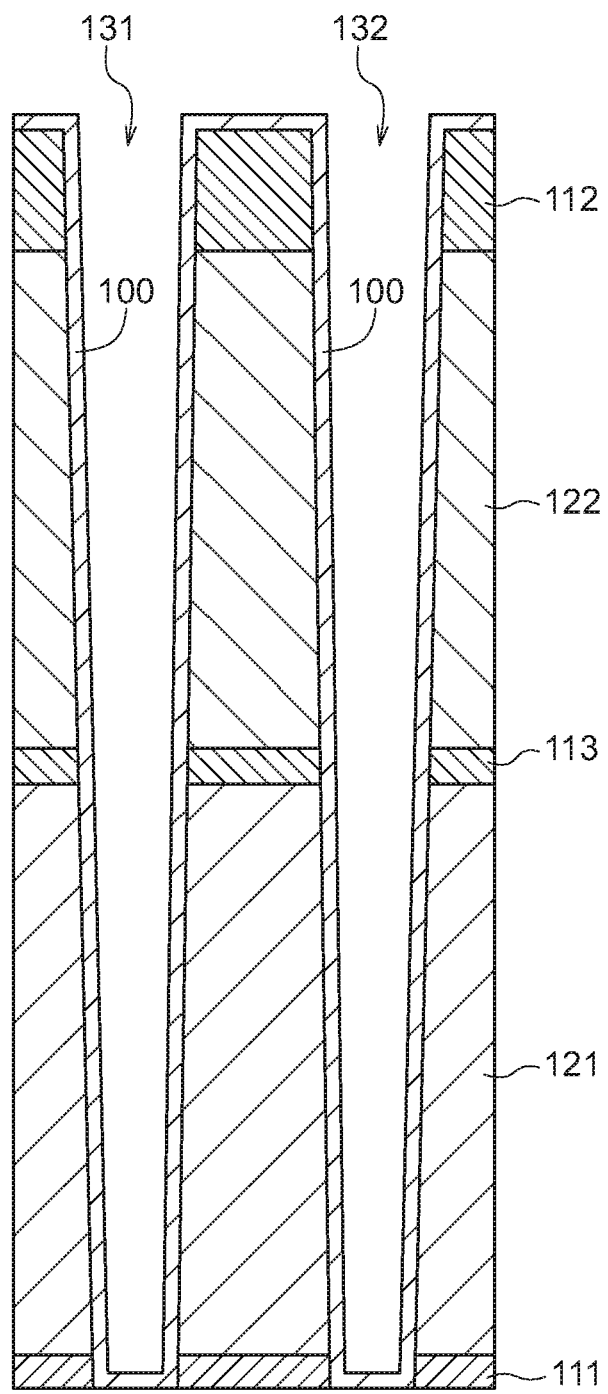

Next, as shown in FIG. 5, the bottom electrode 100 comprising TIN is formed entirely thereon. Accordingly, inner walls and bottom surfaces of the container holes 131 and 132 and the top surface of the $Si_3N_4$ film 112 are covered by the bottom electrode 100. The bottom electrode 100 can be deposited by the ALD method using $TiCl_4$ gas and $NH_3$ gas. The deposition temperature of the bottom electrode 100 is preferably between 380° C. and 610° C. This is because setting the deposition temperature between 380° C. and 610° C. enables TiN rich in the (111) crystal orientations to be formed when TiN is deposited by the ALD method. The ratio of the (111) crystal orientations in the TiN film to the (200) crystal orientations is likely to be larger as the deposition temperature is higher. Particularly when the deposition temperature is set between 540° C. and 610° C., the cylinders hardly collapse during the manufacturing process even if the film thickness of the bottom electrode 100 is thinned to about 45 Å to 70 Å. As described above, the crystal orientations of the bottom electrode 100 indicate the crystal orientations with respect to a foundation surface at the time of forming the bottom electrode 100. Therefore, the crystal orientations of the bottom electrode 100 formed on the inner walls of the container holes 131 and 132 are crystal orientations with respect to the inner wall surfaces of the container holes 131 and 132.

Figure 6:
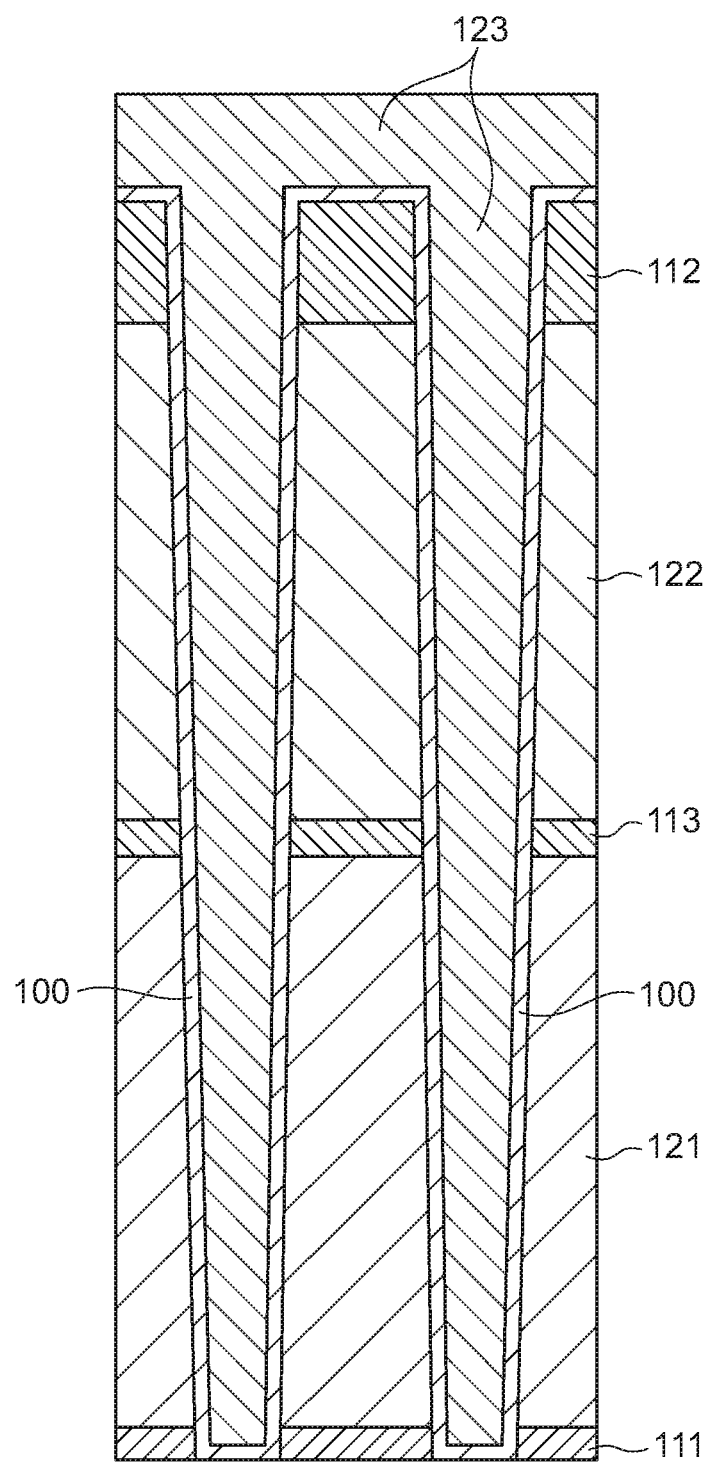

Next, a polysilicon film 123 is formed entirely thereon by the CVD method as shown in FIG. 6. The polysilicon film 123 may be formed not only on the $Si_3N_4$ film 112 but also in the internal diameter parts of the container holes 131 and 132. Accordingly, the internal diameter parts of the container holes 131 and 132 are embedded by the polysilicon film 123. While it is not essential that the internal diameter parts of the container holes 131 and 132 are completely embedded by the polysilicon film 123, it is preferable that the entire surface of the bottom electrode 100 be covered by the polysilicon film 123. This enables the bottom electrode 100 to be protected by the polysilicon film 123 in subsequent processes. Meanwhile, when the polysilicon film 123 is formed only on the $Si_3N_4$ film 112 and is not formed in the internal diameter parts of the container holes 131 and 132, there is an advantage that removal of the polysilicon film 123 from the internal diameter parts of the container holes 131 and 132 at a later step is not required.

Figure 7:
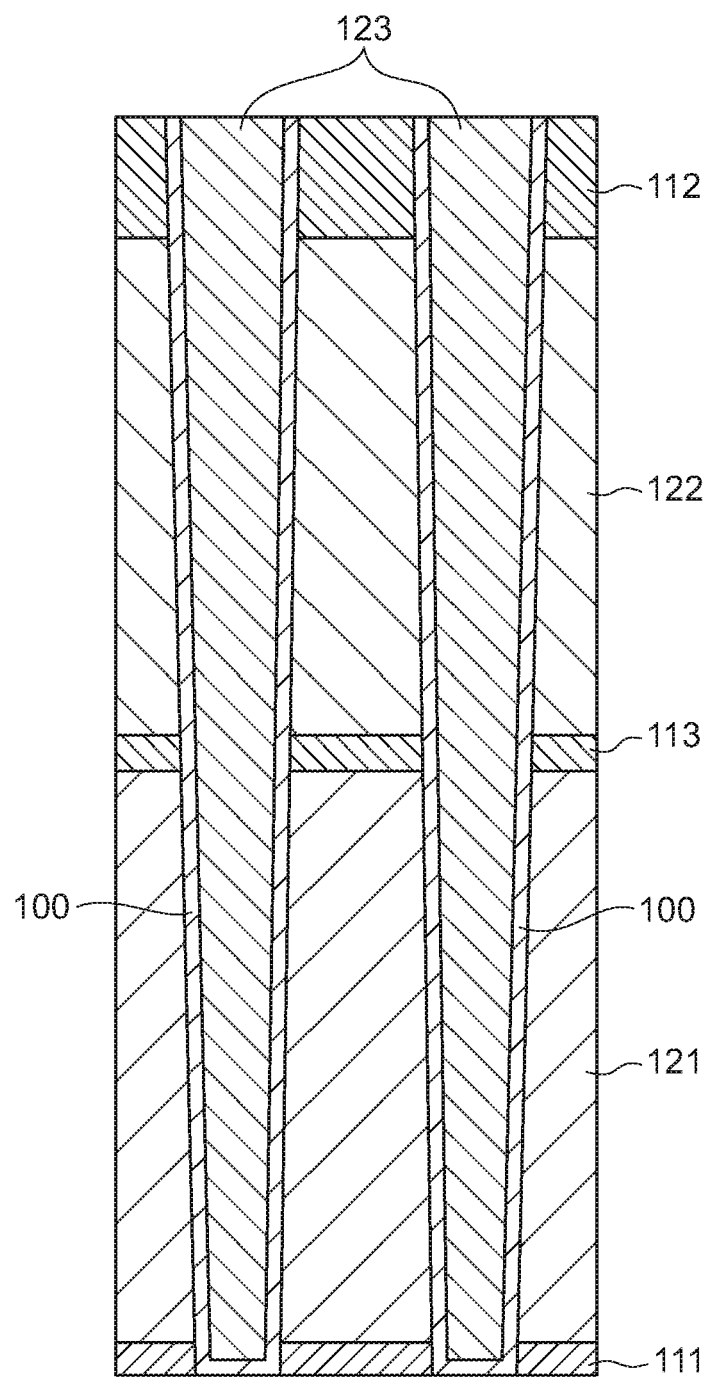
Figure 8:
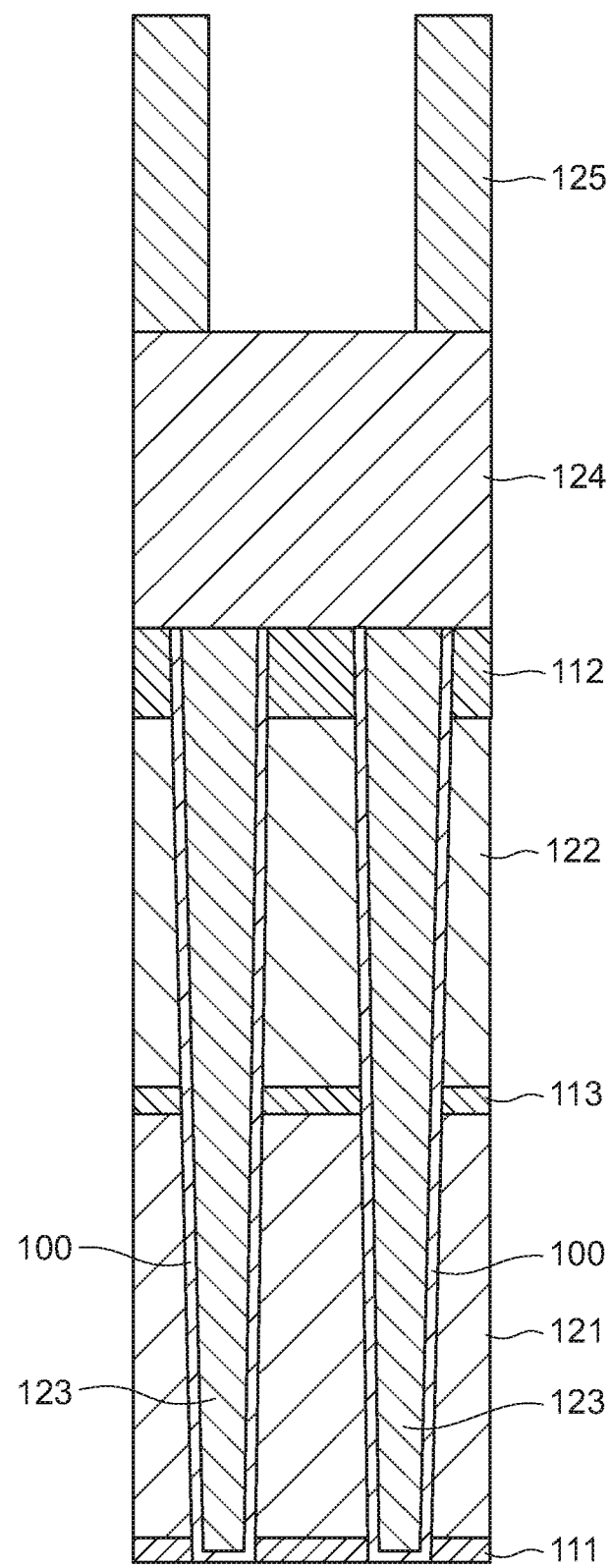
Figure 9:
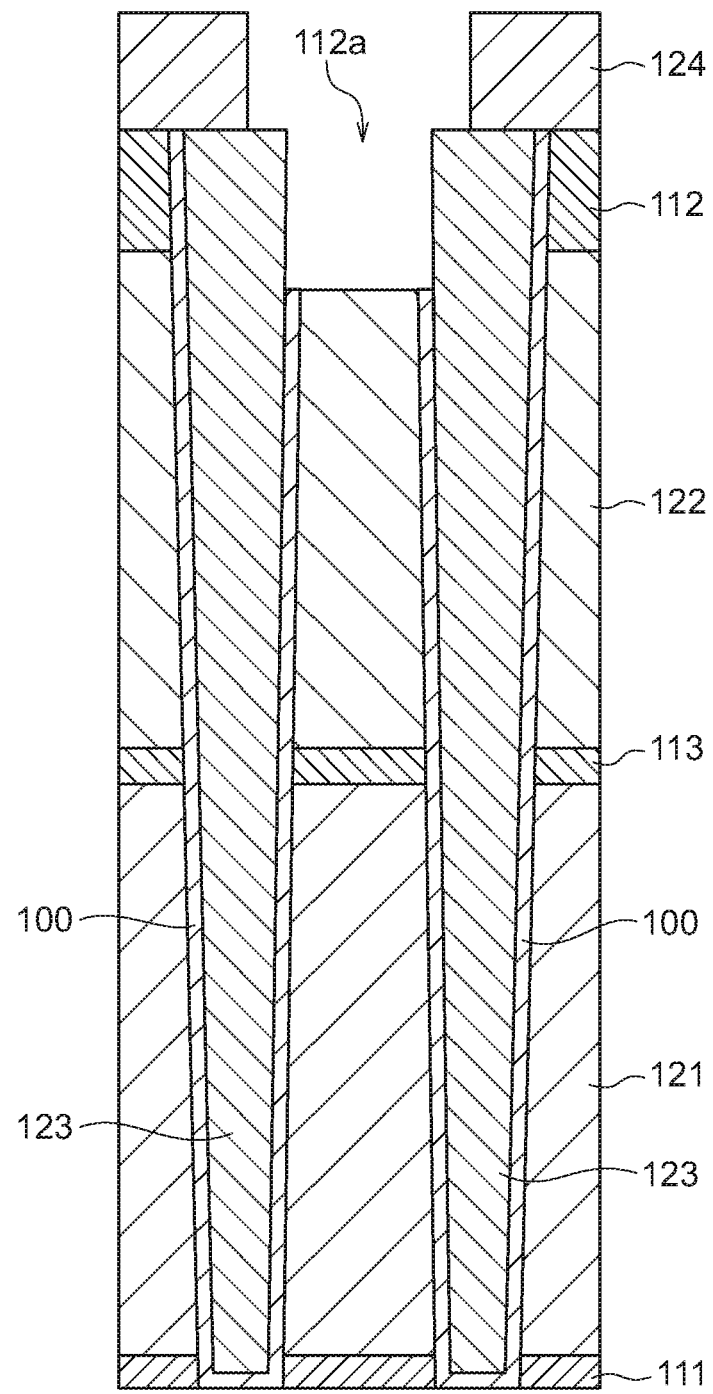

Next, as shown in FIG. 7, CMP (Chemical Mechanical Polishing) is performed using the $Si_3N_4$ film 112 as a stopper. This removes the polysilicon film 123 and the bottom electrode 100 formed on the $Si_3N_4$ film 112. Next, as shown in FIG. 8, a hard mask 124 is formed entirely thereon, then a photoresist 125 is formed on the top surface of the hard mask 124, and the photoresist 125 is patterned by a photolithography method. The hard mask 124 may have a single-layer structure or a multi-layer structure. After the pattern shape of the photoresist 125 is transferred to the hard mask 124, dry etching is performed via the hard mask 124. Accordingly, the $Si_3N_4$ film 112 is patterned as shown in FIG. 9 and an opening 112a is formed on the $Si_3N_4$ film 112. The $SiO_2$ film 122 is exposed in the opening 112a.

Figure 10:
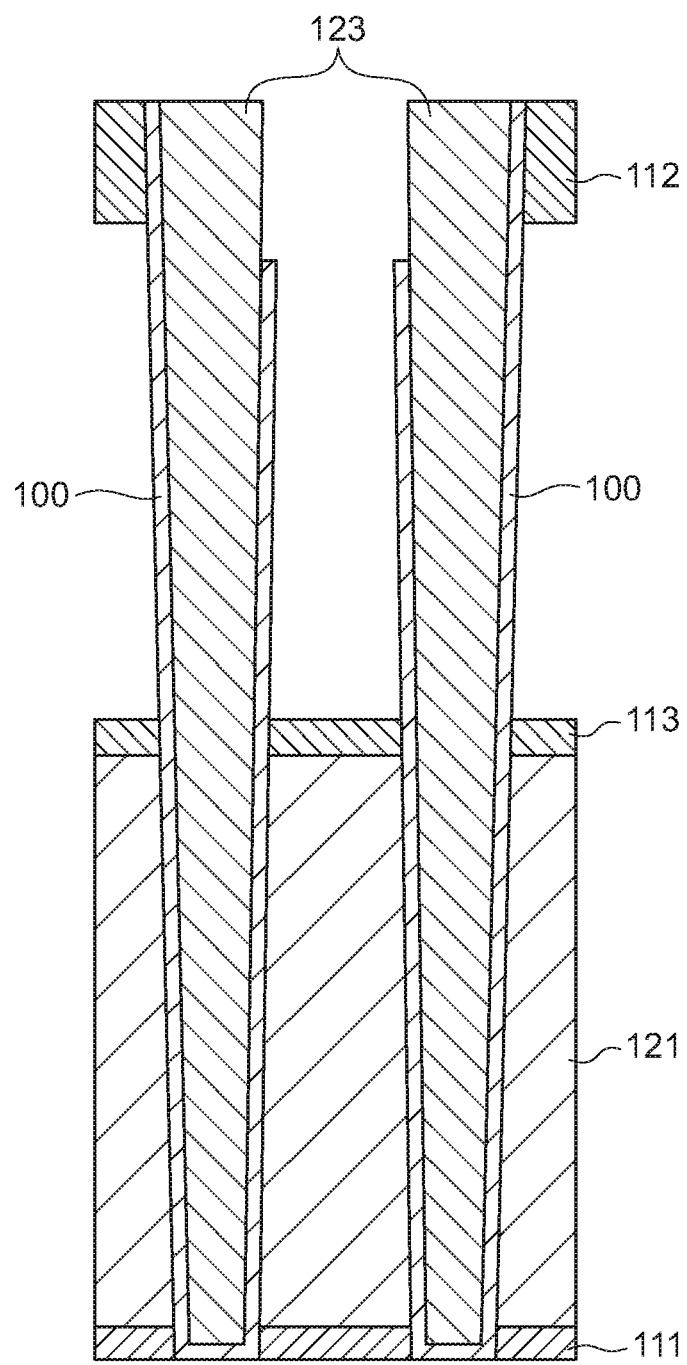
Figure 11:
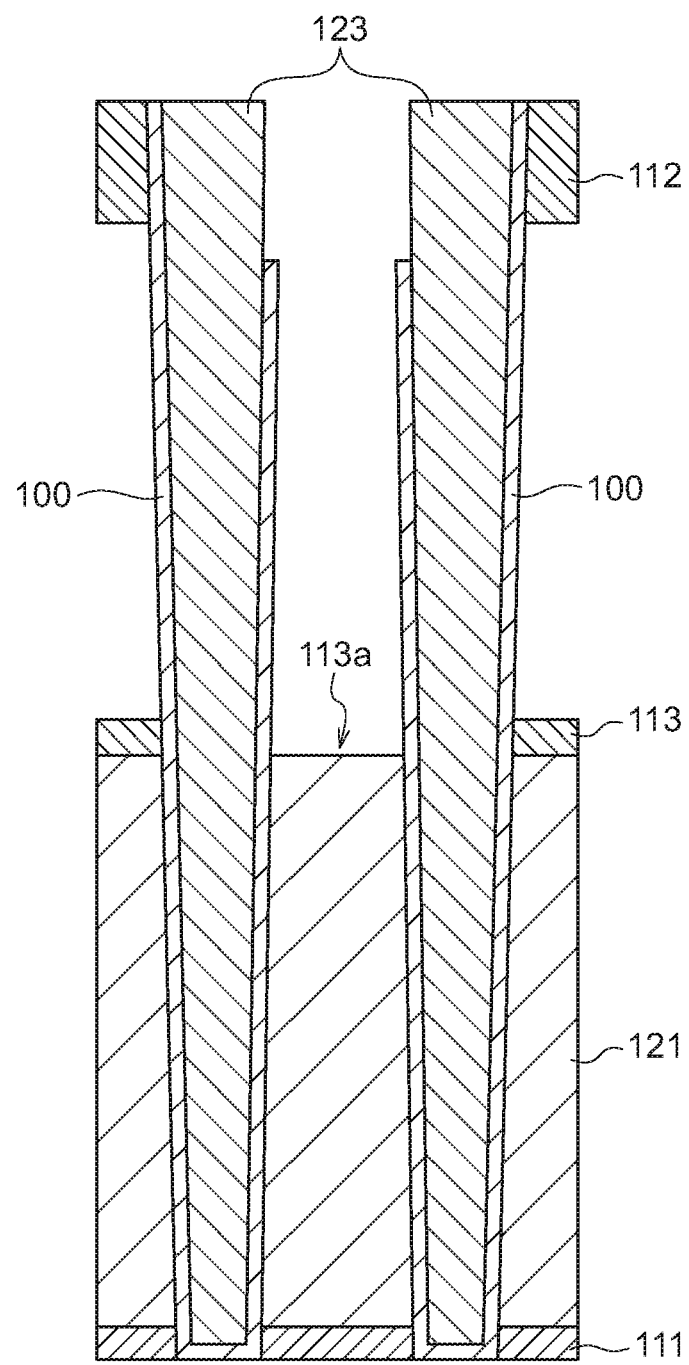
Figure 12:
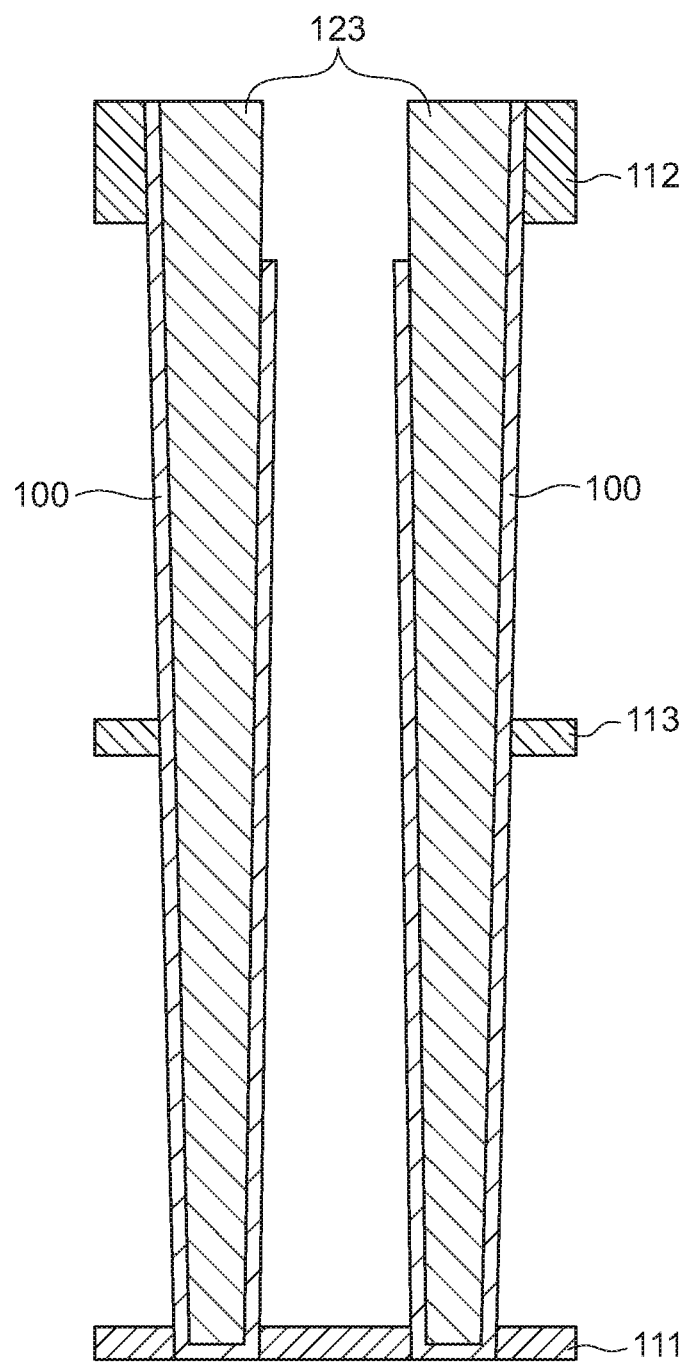

After the opening 112a is formed on the $Si_3N_4$ film 112, the $SiO_2$ film 122 is all removed via the opening 112a as shown in FIG. 10. The $SiO_2$ film 122 may be removed by dry etching or wet etching. Accordingly, the $Si_3N_4$ film 113 having been covered by the $SiO_2$ film 112 is exposed. Next, as shown in FIG. 11, the $Si_3N_4$ film 113 is patterned to form an opening 113a. The BPSG film 121 is exposed in the opening 113a After the opening 113a is formed on the $Si_3N_4$ film 113, the BPSG film 121 is all removed via the opening 113a as shown in FIG. 12. The BPSG film 121 can be removed by wet etching using the HF liquid. At this time, when the film thickness of the bottom electrode 100 comprising TiN is small, there is a risk that the HF liquid may penetrate through the TiN film to etch underlying silicon dioxide that is not to be etched. However, because the TiN comprised in the bottom electrode 100 is rich in the (111) crystal orientations in the present embodiment, the strength of the bottom electrode 100 is high and penetration of the HF liquid can be prevented sufficiently as long as the film thickness is at least 45 Å.

Figure 13:
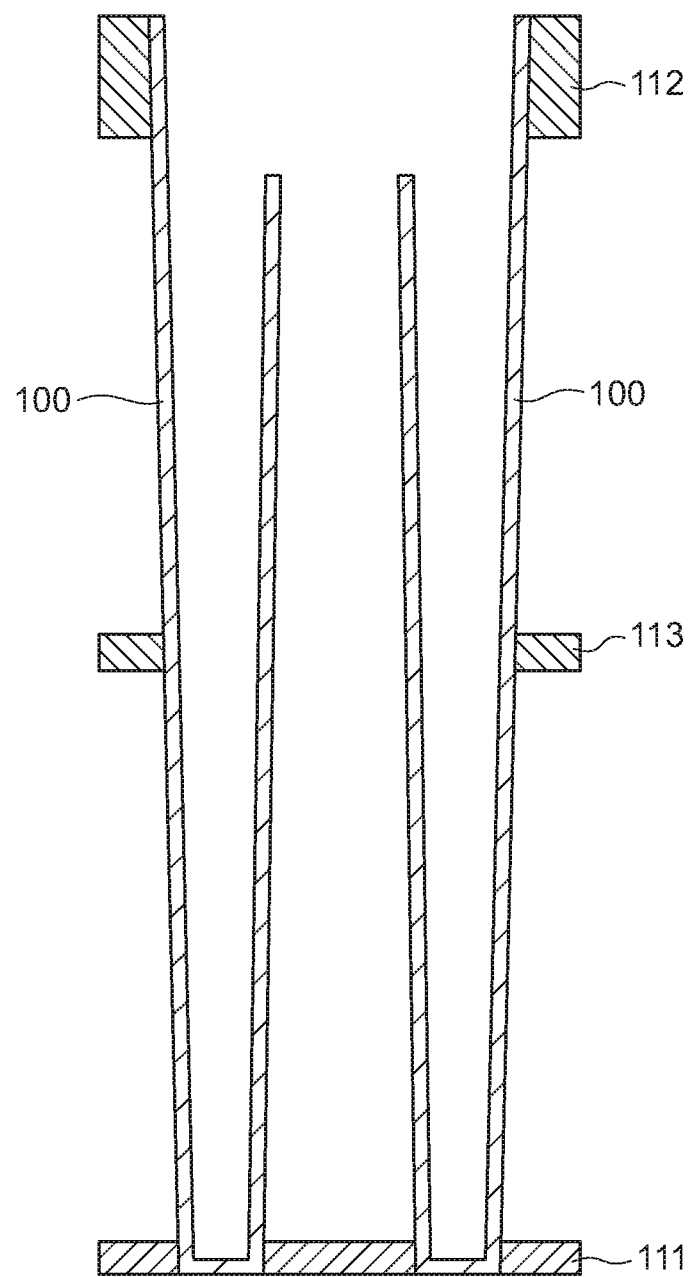
Figure 14:
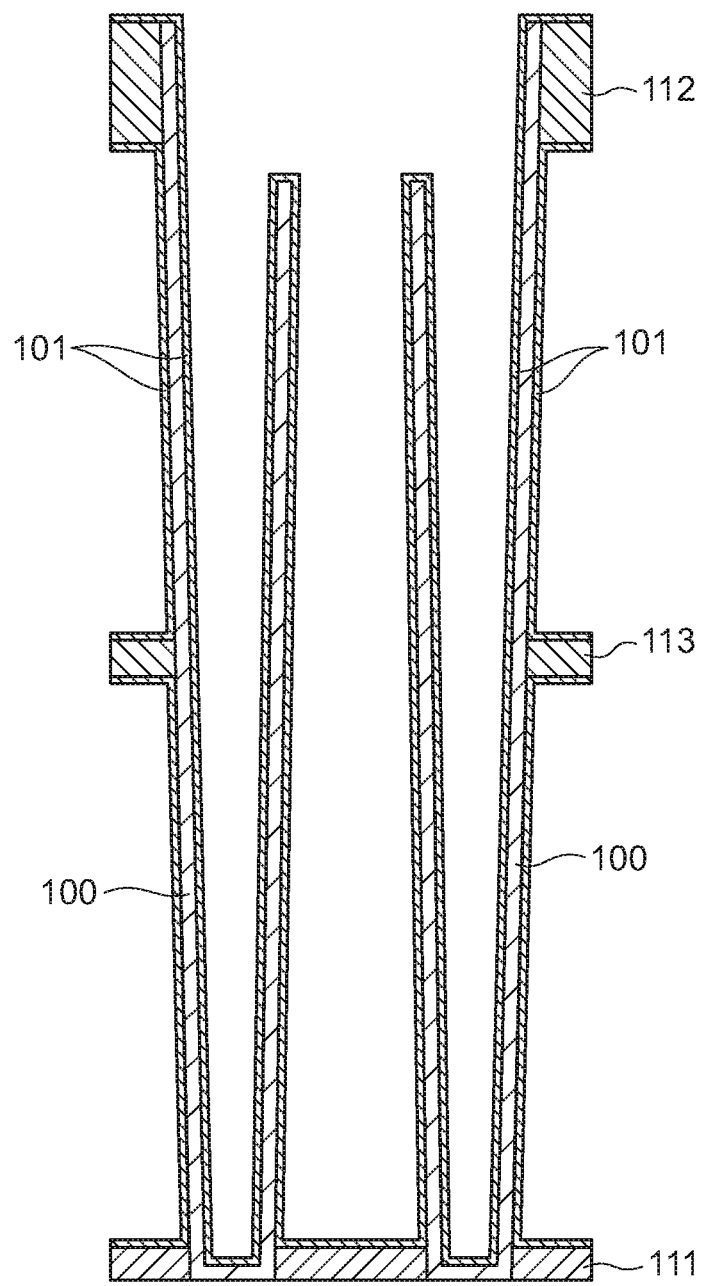

Next, after the polysilicon film 123 is all removed as shown in FIG. 13, the dielectric film 101 including a high-K material is deposited as shown in FIG. 14. Accordingly, exposed surfaces of the bottom electrode 100 are all covered by the dielectric film 101. When the aspect ratio of the cylinders is high, the cylinders may collapse during the manufacturing process. However, because the TiN comprised in the bottom electrode 100 is rich in the (111) crystal orientations in the present embodiment, the strength of the bottom electrode 100 is high and furthermore the upper parts of the cylinders and the substantially-intermediate parts thereof in the height direction are supported by the $Si_3N_4$ film 112 and the $Si_3N_4$ film 113, respectively. Therefore, collapse of the cylinders can be prevented.

Next, as shown in FIG. 1, the top electrode 102 comprising TiN is formed entirely thereon including the internal diameter parts of the cylinders by the ALD method. Accordingly, the cell capacitors C1 and C2 having the cylinder shape and each including the bottom electrode 100, the dielectric film 101, and the top electrode 102 are formed. After the polysilicon film 103 is formed entirely thereon by the CVD method, the plate electrode 104 including tungsten is formed by the spattering method, whereby the semiconductor device shown in FIG. 1 is completed.

As described above, because the bottom electrode 100 of the cell capacitors C1 and C2 comprises the TiN film rich in the (111) crystal orientations in the present embodiment, a sufficient mechanical strength can be ensured, and penetration of the HF liquid can be prevented even if the film thickness of the bottom electrode 100 is thinned to about 45 Å to 140 Å. Furthermore, because the film thickness of the bottom electrode 100 can be thinned, the upper parts of the cylinders are not closed.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising a capacitor, the capacitor comprising:
   a bottom electrode comprising TiN having (111) crystal orientation and (200) crystal orientation;
   a top electrode; and
   a dielectric film disposed between the bottom electrode and the top electrode,
   wherein the TiN in the bottom electrode has more (111) crystal orientation than (200) crystal orientation.

2. The apparatus of claim 1, wherein the TiN includes the (111) crystal orientation more than 7 times the (200) crystal orientation.

3. The apparatus of claim 1, wherein the bottom electrode has a thickness between 45 Å to 140 Å.

4. The apparatus of claim 3, wherein the bottom electrode has a thickness between 45 Å to 70 Å.

5. The apparatus of claim 1, wherein the bottom electrode has a height between 1400 nm to 1600 nm.

6. The apparatus of claim 1, wherein the bottom electrode has a cylindrical shape.

7. The apparatus of claim 6, wherein the capacitor is included in a plurality of capacitors, and the plurality of capacitors are regularly arranged in which an arrangement pitch is 50 nm to 70 nm.

8. The apparatus of claim 1, wherein the top electrode comprises TiN.

9. The apparatus of claim 8, wherein the top electrode has a different crystal orientation from the bottom electrode.

10. An apparatus comprising:
    a bit line;
    a cell capacitor;
    a cell transistor coupled between the bit line and the cell capacitor; and
    a word line coupled to a control electrode of the cell transistor,
    wherein the cell capacitor comprises:
        a bottom electrode coupled to the cell transistor;
        a top electrode; and
        a dielectric film provided between the bottom electrode and the top electrode,
    wherein the bottom electrode comprises TiN having (111) crystal orientation and (200) crystal orientation, and
    wherein the TiN has more (111) crystal orientation than (200) crystal orientation, and
    wherein the bottom electrode has a thickness between 45 Å to 140 Å.

11. The apparatus of claim 10, wherein the bottom electrode has a thickness between 45 Å to 70 Å.

12. The apparatus of claim 10, wherein the bottom electrode has a height between 1400 nm to 1600 nm.

13. The apparatus of claim 10, wherein the cell capacitor is included in a plurality of the cell capacitors, and the plurality of the cell capacitors are regularly arranged in which an arrangement pitch is 50 nm to 70 nm.

* * * * *